(12) United States Patent
Nishitsuka et al.

(10) Patent No.: US 6,515,311 B1
(45) Date of Patent: Feb. 4, 2003

(54) GALLIUM NITRIDE BASED SEMICONDUCTOR LIGHT EMITTING DEVICE

(75) Inventors: Mitsuru Nishitsuka, Tsurugashima (JP); Kiyofumi Chikuma, Tsurugashima (JP)

(73) Assignee: Pioneer Corporation, Tokyo (JP)

( * ) Notice: Subject to any disclaimer, the term of this patent is extended or adjusted under 35 U.S.C. 154(b) by 0 days.

(21) Appl. No.: 09/576,859

(22) Filed: May 22, 2000

(30) Foreign Application Priority Data

May 21, 1999 (JP) .......................................... 11-141617

(51) Int. Cl.$^7$ .......................... H01L 33/00; H01L 27/15
(52) U.S. Cl. ................................ 257/99; 257/86; 257/96
(58) Field of Search ............................. 257/94, 96, 99, 257/101, 102, 103, 45, 97, 86; 438/22, 29, 46, 47

(56) References Cited

U.S. PATENT DOCUMENTS 6,015,979 A * 1/2000 Sugiura et al. ............... 257/86

* cited by examiner

Primary Examiner—Olik Chaudhuri
Assistant Examiner—Hoa B. Trinh
(74) Attorney, Agent, or Firm—Crowell & Moring LLP

(57) ABSTRACT

A GaN based semiconductor laser device which can prevent guided mode light emitted from the active layer from leaking through the cladding layer to the underlying layer without making the cladding layer excessively thick is provided. The device is characterized in that if an n-type cladding layer, a waveguide layer and a p-type cladding layer are collectively defined as a first three-layer waveguide path and a substrate, an underlying layer and an n-type cladding layer are collectively defined as a second three-layer waveguide path, then effective refractive indices of light propagating through the first and second three-layer waveguide paths are set different from each other.

6 Claims, 4 Drawing Sheets

US 6,515,311 B1

GALLIUM NITRIDE BASED SEMICONDUCTOR LIGHT EMITTING DEVICE

BACKGROUND OF THE INVENTION

1. Field of the Invention

The present invention relates to a gallium nitride based semiconductor light emitting device.

2. Description of the Related Art

A gallium nitride (hereinafter referred to as GaN) based semiconductor laser device using a GaN based compound is employed in an optical pickup device for an optical disk as a short wavelength semiconductor laser device for a wavelength range of about 300 to 500 nm.

As shown in FIG. 1, a conventional GaN based semiconductor laser device is made of a multilayer structure formed by providing semiconductor single crystal layers each composed of a GaN based compound on a sapphire substrate 1. The conventional example shown in FIG. 1 is a multilayer structure in which an underlying layer 2, an n-type cladding layer 3, an n-type guiding layer 4, an active layer 5, a p-type guiding layer 6, a p-type cladding layer 7, and a p-type contact layer 8 are deposited on the sapphire substrate 1. In this case, each of the layers is formed of a GaN based compound of which a component ratio is expressed as follows.

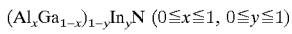

$(Al_xGa_{1-x})_{1-y}In_yN \; (0 \leq x \leq 1, \; 0 \leq y \leq 1)$

Each of the layers is properly doped with a dopant so as to make the layer as an n-type semiconductor or a p-type semiconductor. Further, on the underlying layer 2 and the p-type contact layer 8, there are disposed an n-side electrode 9 and a p-side electrode 10. Furthermore, the p-type cladding layer 7 and the p-type contact layer 8 are provided with a ridge so as to improve the light emission efficiency as a light emitting device. Because by using the ridge structure, a current flow and optical field are concentrated at a part thereof.

In the above arrangement, if a potential is applied between the n-side electrode 9 and the p-side electrode 10, an electron and a hole are recombined with each other in the active layer 5 to emit a light beam. The light beam is propagated through a waveguide formed by the n-type guiding layer 4 and the p-type guiding layer 6 (hereinafter the n-type guiding layer 4, the active layer 5 and the p-type guiding layer 6 are referred to as a waveguide layer).

Incidentally, it is difficult for the GaN based compound to be greatly changed in its refractive index even if a third element is doped therein. As shown in FIG. 2, if a difference in refractive index between the n-type cladding layer 3 and the n-type guiding layer 4 is small, a main lobe 20 of light beams emitted from the active layer 5 can be propagated through the guiding layer. However, side lobes 21, 22, 23 leak from the guiding layer 4 through the n-type cladding layer 3 to the underlying layer 2. For this reason, a far-field distribution of a laser light beam emitted from the device is deviated from a Gaussian distribution. That is, undesirable large magnitude of ripples are observed in the far-field distribution.

In this case, the n-type cladding layer 3 can be designed to have a sufficient thickness so as to prevent the leakage of the light to the underlying layer 2. However, if the n-type cladding layer 3 is made too thick, then the manufacturing cost thereof will unfavorably increase.

OBJECTS AND SUMMARY OF THE INVENTION

Therefore, an object of the present invention is to provide a GaN based semiconductor laser device which can prevent the leakage of the light, which emits from the active layer, through the cladding layer to the underlying layer without making the cladding layer excessively thick.

According to the present invention, there is provided a gallium nitride based semiconductor light emitting device having a multilayer structure obtained by depositing at least an underlying layer, an n-type cladding layer, a waveguide layer containing an active layer, and a p-type cladding layer in this order on a substrate, wherein if the n-type cladding layer, the waveguide layer and the p-type cladding layer are collectively defined as a first three-layer waveguide path and the sapphire substrate, the underlying layer and the n-type cladding layer collectively defined as a second three-layer waveguide path, then effective refractive indices of light propagating through the first and second three-layer waveguide paths are set to be different from each other.

According to the above arrangement of the device, the effective refractive index of light propagating through the first three-layer waveguide path is different from the effective refractive index of light propagating through the second three-layer waveguide path. Therefore, it becomes possible to prevent the leakage of the light, which emits from the active layer, through the cladding layer to the underlying layer due to the mode coupling.

DETAILED DESCRIPTION OF THE PREFERRED EMBODIMENTS

Figure 1:
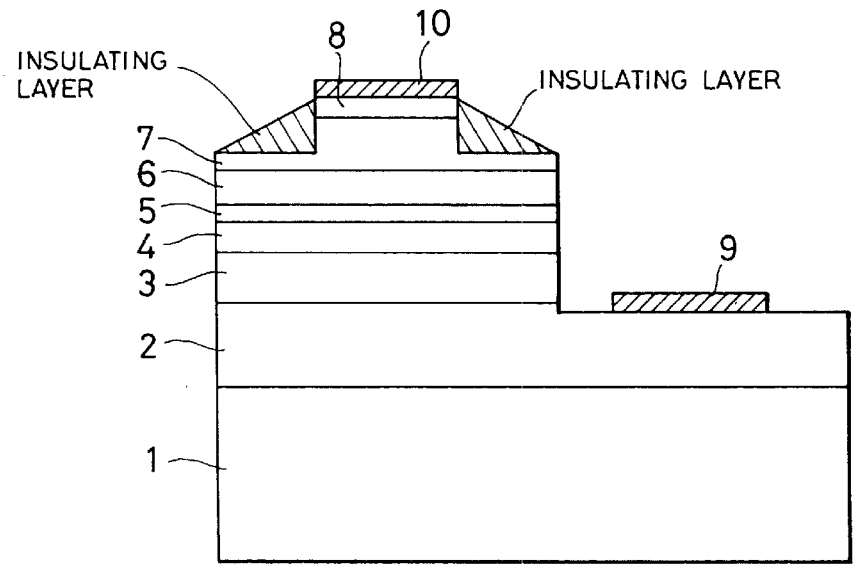
FIG. 1 is a cross-sectional view showing a structure of a GaN based semiconductor laser device.
Figure 2:
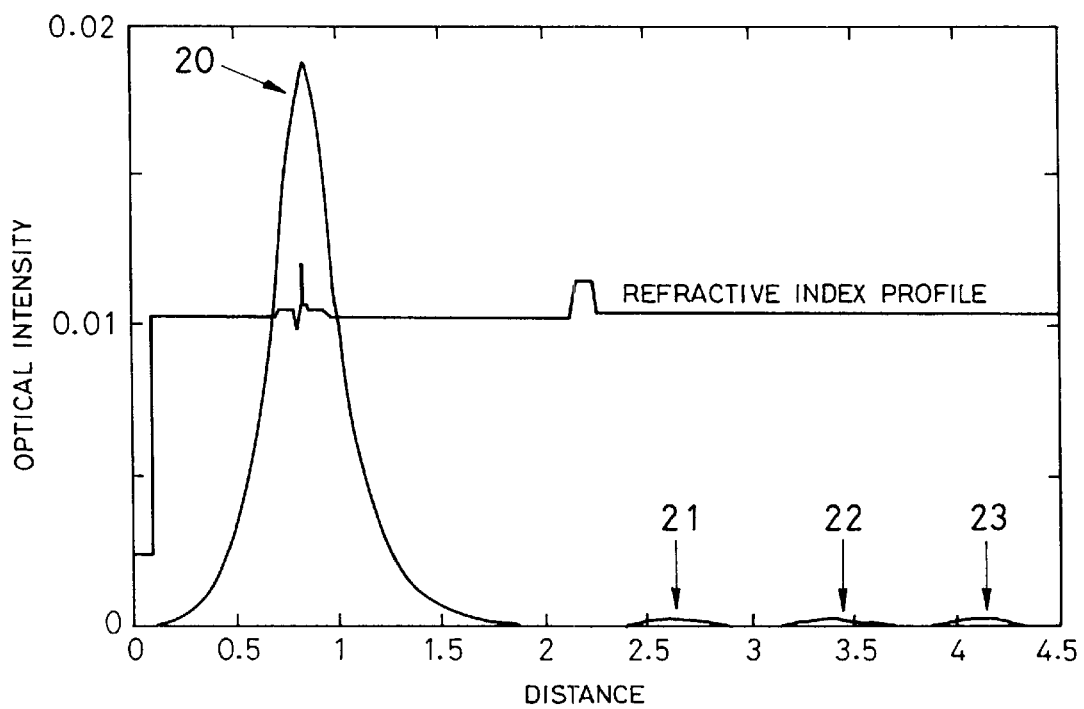
FIG. 2 is a graph illustrating an optical intensity distribution of a conventional GaN based semiconductor laser device.

The GaN based semiconductor laser device according to the present invention has the same structure as that of the conventional GaN based semiconductor laser device shown in FIG. 1.

Figure 3:
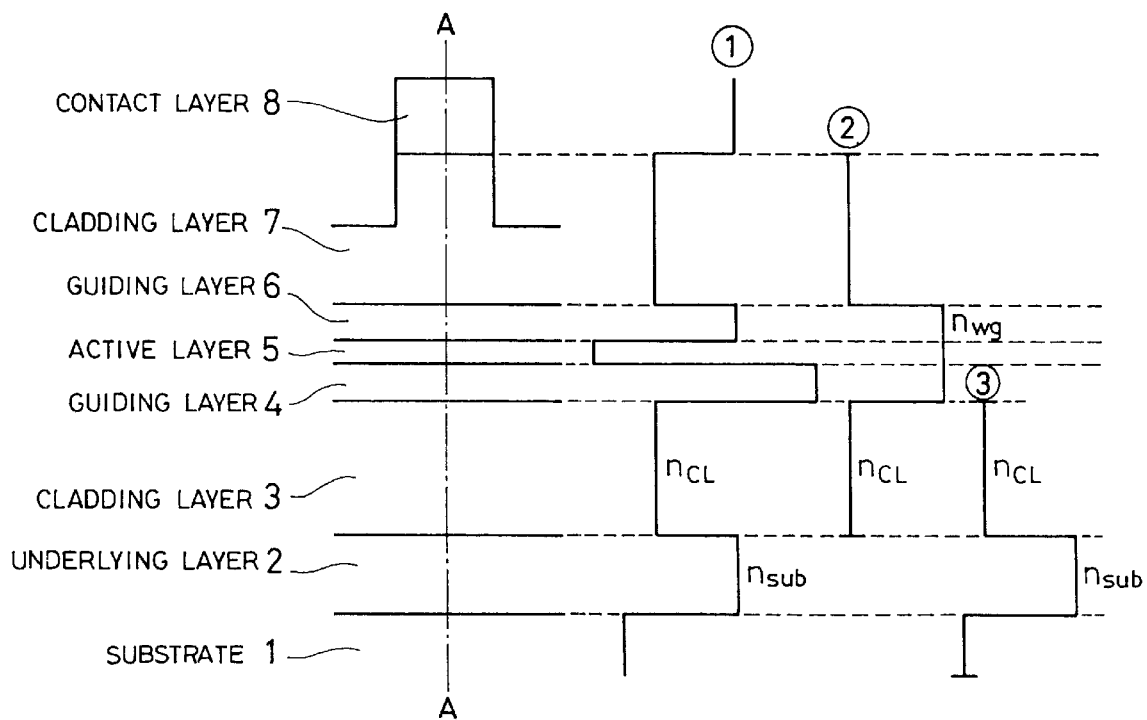
FIG. 3 is a graph illustrating a refractive index distribution of a GaN based semiconductor laser device according to the present invention.

In a refractive index distribution (1) along the line A—A in FIG. 3, $n_{sub}$ and $n_{CL}$ are taken as refractive indices of the underlying layer 2 and the n-type cladding layer 3, respectively. Further, the refractive indices of the n-type guiding layer 4, the active layer 5 and the p-type guiding layer 6 are simply averaged to yield a refractive index, $n_{wg}$ as the refractive index of the wave guide layer.

In this case, two three-layer waveguide paths are defined. A first three-layer waveguide path is composed of the n-type cladding layer 3, the waveguide layer and the p-type cladding layer 7. A second three-layer waveguide path is composed of the sapphire substrate 1, the underlying layer 2, and the n-type cladding layer 3. Refractive indices of the first and second three-layer waveguide paths are given by refractive index distributions (2) and (3), respectively. See in FIG. 3.

In the first three-layer waveguide path, a normalized frequency $V_{wg1}$ can be expressed by the following equation 1.

$$V_{wg1}=(2\pi/\lambda)r_{wg}\sqrt{n_{wg}^2-n_{CL}^2} \quad \text{(Equation 1)}$$

where $\lambda$ represents the wavelength of the light generated from the active layer 5; and $r_{wg}$ a thickness of the waveguide layer, i.e., the total thickness of the n-type guiding layer 4, the active layer 5, and the p-type guiding layer 6.

Figure 4:
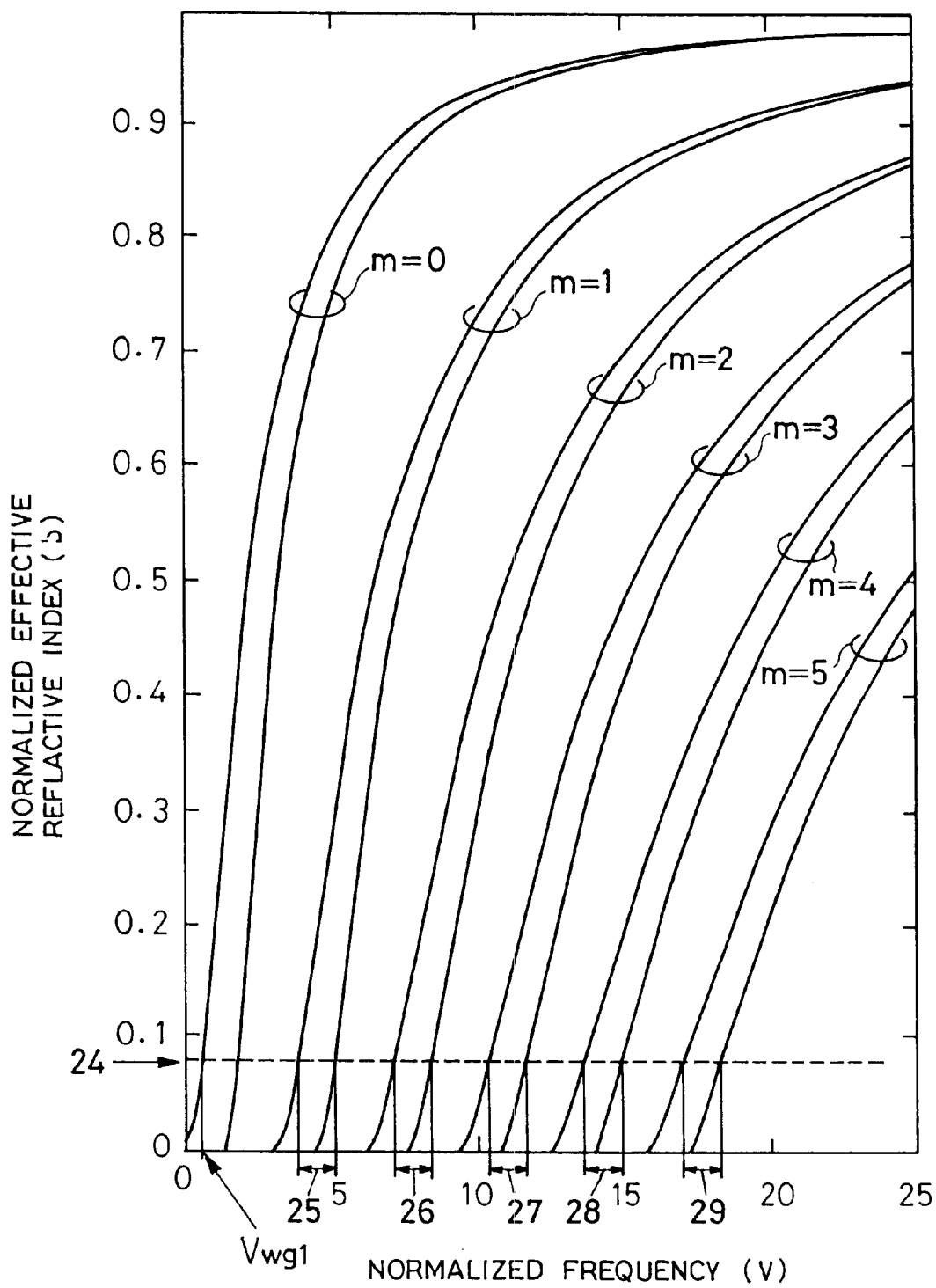
FIG. 4 is a graph illustrating a relationship between a normalized frequency and an effective refractive index.

As shown in FIG. 4, the normalized frequency $V_{wg1}$ calculated by Equation 1 is utilized for determining a normalized effective refractive index $b_{wg}$ when zero-order mode light propagates through the waveguide layer. Thus, a value 24 is determined for the first three-layer waveguide path. When the zero-order mode light, as a main lobe, is propagated through the waveguide layer having the normalized effective refractive index $b_{wg}$, a high-order mode light other than the zero-order mode light, such as a first-order mode light is propagated through a mode field having a normalized frequency of a value 25. Similarly, light beams of high-order mode, for example second order or greater as side lobes, are respectively propagated through mode fields having normalized frequencies of value 26 (for second-order light beam), value 27 (for third-order light beam), value 28 (for fourth-order light beam), and value 29 (for fifth-order light beam), and so on.

In order to prevent the leakage from the first three-layer waveguide through the n-type cladding layer 3 to the second three-layer waveguide, i.e., the underlying layer 2, the normalized frequency $V_{wg2}$ of the second three-layer waveguide path is to be selected differently from the values 25 to 29 so that the mode coupling of the second three-layer waveguide and the first three-layer waveguide path is neglected.

The normalized frequency $V_{wg2}$ of the second three-layer waveguide path can be calculated by the following equation similarly to the case of the normalized frequency $V_{wg1}$.

$$V_{wg2}=(2\pi/\lambda)r_{sub}\sqrt{n_{sub}^2-n_{CL}^2} \quad \text{(Equation 2)}$$

where $r_{sub}$ b represents a thickness of the underlying layer 2. A set of $r_{sub}$ and $n_{sub}$ can be obtained by selecting a value different from the values 25 to 29 for the normalized frequency $V_{wg2}$ and calculating Equation 2 with the selected value.

As described above, it is difficult to greatly change the refractive index of the GaN compound. Thus, if it is difficult to manufacture the underlying layer 2 so that the layer has the obtained $n_{sub}$ from a practical standpoint, then values of $r_{wg}$ or the like are differently selected in the process of calculation of Equation 1, and the calculation is repeatedly carried out to find proper solutions.

With respect to the GaN based semiconductor laser devices composed of a waveguide layer having a thickness $r_{wg}$, an underlying layer having a thickness $r_{sub}$ and a refractive index $n_{sub}$, and an n-type cladding layer 3 having a refractive index $n_{CL}$ of which thickness $r_{sub}$ and the refractive index $n_{sub}$ were determined by the above calculation process, the present inventors carried out calculation by using an FEM (Finite Element Method) to plot a diagram of leakage ratio indicative of a relation between the thickness of the n-type cladding layer 3 and a molar fraction ratio x of AlN contained in the n-type $Al_xGa_{1-x}N$ cladding layer 3. Wherein the refractive index of the n-type cladding layer 3 changes in proportion to the molar fraction ratio x of AlN contained in the n-type $Al_{xGa1-x}N$ cladding layer 3.

Figure 5:
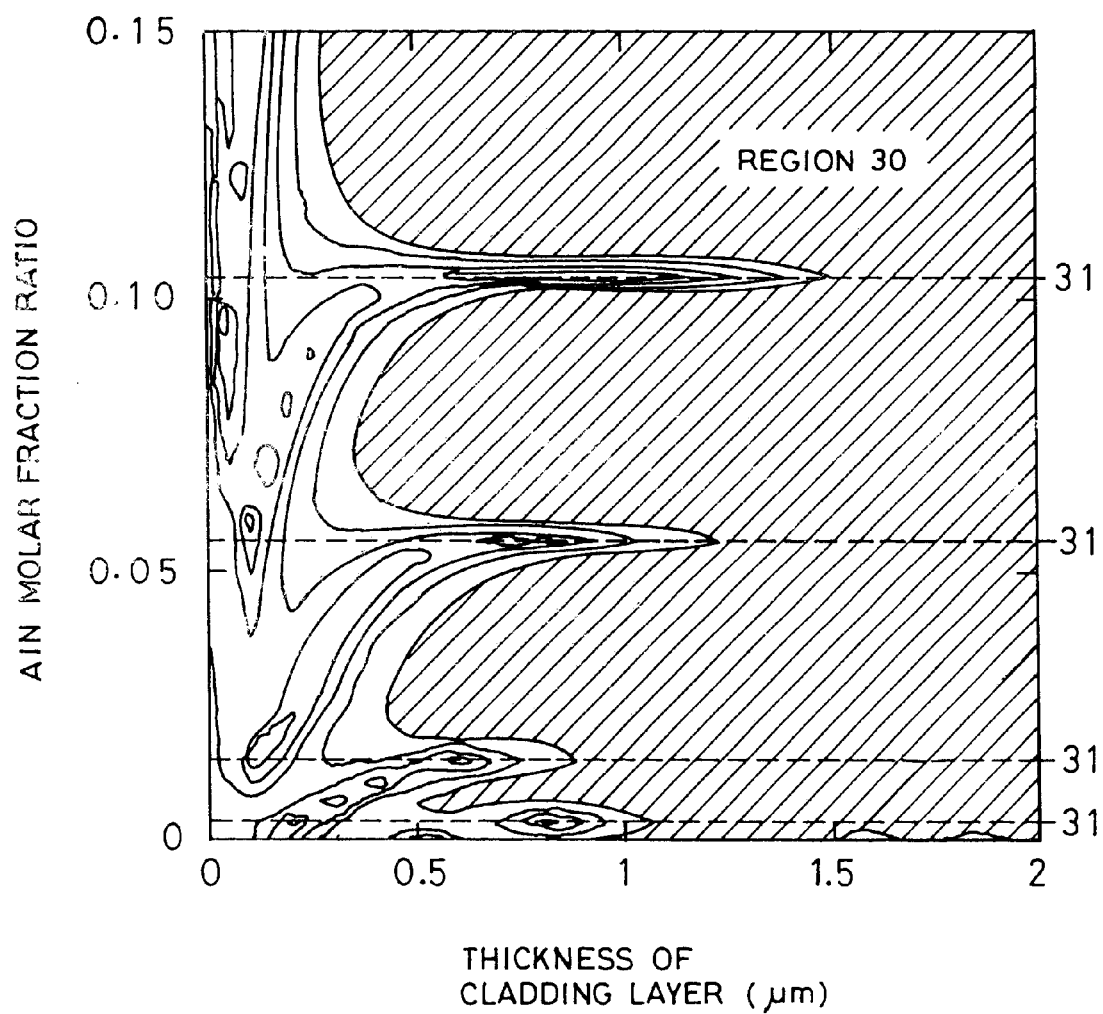
FIG. 5 is a two-dimensional diagram illustrating how leakage light intensity varies in response to variation of a thickness of a cladding layer and an AlN molar fraction ration of the cladding of $Al_xGa_{1-x}N$ in the GaN based semiconductor laser device according to the present invention.

As FIG. 5 shows, reference numeral 30 represents a region where the light leakage ratio is smaller than 10%, or where the thickness of the n-type cladding layer 3 and the molar fraction ratio x of AlN contained in the n-type cladding layer 3 constitute a favorable characteristic of the light emitting device. As will be understood from the diagram, the undesired region (i.e., a region other than the region 30) expand toward the thickness direction of the cladding layer 3 at several values 31 of the AlN molar fraction ratio. If the AlN molar fraction ratio of the $Al_xGa_{1-x}N$ cladding layer 3 is selected to the values 31, the increase of the thickness will not contribute to suppress the leakage of the guided light. According to the GaN based semiconductor laser device of the present invention, it becomes possible to avoid an undesired AlN molar fraction ratio and corresponding refractive index from the manufacturing standpoint, with the result that it becomes possible to find a proper combination of the AlN molar fraction ratio and corresponding refractive index which satisfies the condition represented by the region 30.

According to the GaN based semiconductor laser device of the present invention, it is possible to prevent the guided mode light generated at the active layer from leaking through the cladding layer with a small refractive index to the underlying layer. Thus, the semiconductor laser device of the present invention will exhibit an excellent light emitting characteristic.

What is claimed is:

1. A gallium nitride based semiconductor light emitting device having a multilayer structure obtained by depositing at least an underlying layer, an n-type cladding layer, a waveguide layer containing an active layer, and a p-type cladding layer in this order on a substrate, wherein:

the n-type cladding layer, the waveguide layer and the p-type cladding layer collectively form a first three-layer waveguide path having a normalized frequency $V_{wg1}$ and a first normalized effective refractive index $b_{wg}$, such that when a zero-order mode light beam is propagated as a main lobe through the waveguide layer having the first normalized effective refractive index $b_{wg}$, light beams of higher order modes are propagated through a plurality of mode fields having a plurality of corresponding normalized frequency ranges;

the substrate, the underlying layer and the n-type cladding layer collectively form a second three-layer waveguide path; and parameters of said second three-layer waveguide path are selected such that the second three-layer waveguide path has a normalized frequency $V_{wg2}$ which lies outside said corresponding normalized frequency ranges.

2. The gallium nitride based semiconductor light emitting device according to claim 1, wherein the waveguide layer is composed of an n-type guiding layer, an active layer, and a p-type guiding layer.

3. The gallium nitride based semiconductor light emitting device according to claim 1, wherein said underlying layer is GaN and has a larger refractive index than said n-type cladding layer.

4. The device according to claim 1, wherein a normalized effective refractive index of said second three-layer waveguide path differs from the first normalized effective refractive index $b_{wg}$ of the first three-layer waveguide.

5. The gallium nitride based semiconductor light emitting device according to claim 1, wherein the waveguide layer is composed of an n-type guiding layer, an active layer, and a p-type guiding layer.

6. The gallium nitride based semiconductor light emitting device according to claim 1, wherein said underlying layer is GaN and has a larger refractive index than said n-type cladding layer.

* * * * *